(12) United States Patent
Hayashi et al.

(10) Patent No.: US 7,279,344 B2
(45) Date of Patent: *Oct. 9, 2007

(54) METHOD OF FORMING A NITRIDE-BASED SEMICONDUCTOR

(75) Inventors: Nobuhiko Hayashi, Osaka (JP); Tatsuya Kunisato, Takatsuki (JP); Hiroki Ohbo, Hirakata (JP); Tsutomu Yamaguchi, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/518,174

(22) Filed: Sep. 11, 2006

(65) Prior Publication Data

US 2007/0001192 A1    Jan. 4, 2007

Related U.S. Application Data

(62) Division of application No. 10/796,154, filed on Mar. 10, 2004, now Pat. No. 7,109,530, which is a division of application No. 10/084,050, filed on Feb. 28, 2002, now Pat. No. 6,713,845.

(30) Foreign Application Priority Data

Mar. 1, 2001    (JP)    ............................. 2001-56284

(51) Int. Cl.
*H01L 21/00*    (2006.01)
*H01L 33/00*    (2006.01)
(52) U.S. Cl. .................. 438/22; 438/27; 438/E21.003; 438/E33.043; 257/103; 257/632
(58) Field of Classification Search ............ 257/13–14, 257/84–85; 438/22, 23, 48–52, 478–479
See application file for complete search history.

(56) References Cited

U.S. PATENT DOCUMENTS 6,015,979 A    1/2000    Sugiura et al.

(Continued)

FOREIGN PATENT DOCUMENTS

JP    10-312971    11/1998

(Continued)

OTHER PUBLICATIONS

S. Nakamura et al., "Long lifetime violet InGaN/GaN/AlGaN-based semiconductor lasers", Journal of Oyo Denshi Bussei Bunkakai, vol. 4, (1998), pp. 53-58 and 210-215.

(Continued)

*Primary Examiner*—Dung A. Le
(74) *Attorney, Agent, or Firm*—McDermott Will & Emery LLP

(57) ABSTRACT

A nitride-based semiconductor element having excellent element characteristics is obtained by forming a nitride-based semiconductor layer having excellent crystallinity without performing a long etching process. This nitride-based semiconductor element and the method thereof includes forming a mask layer having a recess portion on a substantially flat upper surface of an underlayer to partially expose the upper surface of the underlayer. A nitride-based semiconductor layer is laterally grown on the exposed part of the underlayer and the mask layer while forming a void on the recess portion of the mask layer. Thus, the strain of the laterally grown nitride-based semiconductor layer is so relaxed that the crystallinity of the nitride-based semiconductor layer is improved.

5 Claims, 16 Drawing Sheets

U.S. PATENT DOCUMENTS

| | | | |
|---|---|---|---|
| 6,051,849 A | 4/2000 | Davis et al. | |
| 6,475,882 B1* | 11/2002 | Sakai et al. | 438/483 |
| 6,503,769 B2 | 1/2003 | Nakamura et al. | |
| 6,759,139 B2* | 7/2004 | Kunisato et al. | 428/620 |
| 2002/0117104 A1 | 8/2002 | Hata et al. | |

FOREIGN PATENT DOCUMENTS

| | | |
|---|---|---|
| JP | 2000-21789 | 1/2000 |
| JP | 2000-164989 | 6/2000 |
| JP | 2000-269144 | 9/2000 |

OTHER PUBLICATIONS

Akira Usui et al., "Thick GaN Epitaxial Growth with Low Dislocation Density by Hydride Vapor Phase Epitaxy", Jpn. J. Appl. Phys. vol. 36 (1997), pp. L899-L902.

Kevin Linthicum et al., "Pendeoepitaxy of gallium nitride thin films", Applied Physics Letter, vol. 75, No. 2, Jul. 12, 1999, pp. 196-198.

Isao Kidoguchi et al., "Air-bridged lateral epitaxial overgrowth of GaN thinfilms", Applied Physics Letter, vol. 76, No. 25, Jun. 19, 2000, pp. 3768-3770.

* cited by examiner

METHOD OF FORMING A NITRIDE-BASED SEMICONDUCTOR

RELATED APPLICATIONS

This application is a divisional of U.S. patent application Ser. No. 10/796,154, filed Mar. 10, 2004, now U.S. Pat. No. 7,109,530, which is a divisional of U.S. patent application Ser. No. 10/084,050, filed Feb. 28, 2002, now U.S. Pat. No. 6,713,845, which is based on Japanese Patent Application No. JP 2001-56284, filed Mar. 1, 2003 the contents of which are hereby incorporated by reference.

BACKGROUND OF THE INVENTION

1. Field of the Invention

The present invention relates to a nitride-based semiconductor element and a method of forming a nitride-based semiconductor, and more specifically, it relates to a nitride-based semiconductor element containing a nitride-based semiconductor formed by epitaxial lateral overgrowth and a method of forming a nitride-based semiconductor.

2. Description of the Prior Art

A technique of growing a nitride-based semiconductor on an underlayer is known in general. For example, a crystal of GaN, which is one of nitride-based semiconductors lattice-matching with only a small number of types of substrates, is grown on a substrate such as a sapphire substrate. In relation to this, generally known is a technique of inserting a buffer layer grown at a low temperature between the substrate and a GaN layer for growing GaN in excellent crystallinity with a small number of crystal defects.

Even if the aforementioned low-temperature buffer layer is employed, however, the density of reducible defects is limited and it is difficult to reduce the number of dislocations. To this end, a technique of reducing the number of dislocations by epitaxial lateral overgrowth (ELOG) of GaN is proposed in general. This epitaxial lateral overgrowth is disclosed in Journal of Oyo Denshi Bussei Bunkakai, Vol. 4 (1998), pp. 53 to 58 and 210 to 215, for example.

FIG. 29 is a sectional view for illustrating a conventional method of forming a nitride-based semiconductor by epitaxial lateral overgrowth. Referring to FIG. 29, a low-temperature buffer layer 102 is first formed on a sapphire substrate 101, and thereafter a GaN layer 103 for serving as an underlayer is grown on the low-temperature buffer layer 102 in the conventional method of forming a nitride-based semiconductor by epitaxial lateral overgrowth.

Then, striped (elongated) mask layers 104 of $SiO_2$ or the like are formed on prescribed regions of the GaN layer 103. The mask layers 104 are employed as selective growth masks for epitaxially laterally overgrowing a GaN layer 105 from the GaN layer 103 serving as an underlayer, so that the GaN layer 105 is vertically (upwardly) grown from exposed portions of the GaN layer 103 and thereafter laterally grown on the mask layers 104. Dislocations extending in the c-axis direction are laterally bent due to this lateral overgrowth, not to reach a portion around the upper surface of the GaN layer 105. Thus, the number of dislocations reaching the flat upper surface of the finally formed GaN layer 105 is remarkably reduced as compared with the GaN layer 103 forming the underlayer.

In the conventional method of forming a nitride-based semiconductor by epitaxial lateral overgrowth shown in FIG. 29, however, the c-axis of the overgrowth region of GaN layer 105 is disadvantageously inclined from the normal direction of the substrate although the number of dislocations resulting from epitaxial lateral overgrowth can be reduced in the GaN layer 105. In other words, the growth layer of the GaN layer 105 laterally grown on the mask layers 104 is strained due to stress applied thereto. Therefore, the c-axis perpendicular to the sapphire substrate 101 is disadvantageously inclined by about 2° at the maximum as shown by arrows in FIG. 29. When the c-axis is displaced, crystallinity is deteriorated to result in inferior element characteristics.

In order to suppress such inclination of the c-axis, therefore, a method shown in FIG. 30 is proposed in general. Referring to FIG. 30, a GaN layer 113 serving as an underlayer is formed on a sapphire substrate 111 through a low-temperature buffer layer 112 in this proposed method. Recess portions are formed on the surface of the GaN layer 113 for thereafter forming mask layers 114 having recess portions 114a of $SiO_2$ or the like in recess portions 113a of the surface. The mask layers 114 are employed as selective growth masks for epitaxially laterally overgrowing a GaN layer 115 on projection portions of the GaN layer 113 serving as an underlayer. In this case, voids 120 are defined between the mask layers 114 and the epitaxially laterally overgrown GaN layer 115, thereby reducing the contact areas between the GaN layer 115 and the mask layers 114 when the GaN layer 115 is laterally grown on the mask layers 114. Thus, stress is hardly applied to the GaN layer 115 laterally grown on the mask layers 114, and hence strain of the GaN layer 115 is relaxed. Consequently, inclination of the c-axis can be relaxed as compared with the prior art shown in FIG. 29, as shown by arrows in FIG. 30.

In the conventional proposed method shown in FIG. 30, however, it is necessary to etch the GaN layer 113 serving as an underlayer for forming the recess portions thereof. In this case, a long time is required for etching the GaN layer 113, disadvantageously leading to a long process time.

In the conventional proposed method shown in FIG. 30, most dislocations 116 are bent in intermediate portions during lateral growth of the GaN layer 115 not to reach the surface, as shown in FIG. 31. However, some of dislocations 116 are not bent but reach the surface as such. In the conventional proposed method, therefore, it is difficult to further reduce the number of dislocations.

SUMMARY OF THE INVENTION

An object of the present invention is to provide a nitride-based semiconductor element having excellent device characteristics by obtaining a nitride-based semiconductor layer having excellent crystallinity without performing a long-time etching process.

Another object of the present invention is to reduce the number of dislocations in an epitaxially laterally overgrown nitride-based semiconductor layer in the aforementioned nitride-based semiconductor element.

Still another object of the present invention is to provide a method of forming a nitride-based semiconductor capable of readily forming a nitride-based semiconductor layer having excellent crystallinity without performing a long-time etching process.

A further object of the present invention is to more effectively reduce the number of dislocations reaching the surface of the nitride-based semiconductor in the aforementioned method of forming a nitride-based semiconductor.

A nitride-based semiconductor element according to a first aspect of the present invention comprises a mask layer, having a recess portion on the upper surface of the mask layer, formed on a substantially flat upper surface of an underlayer to partially expose the upper surface of the underlayer, a nitride-based semiconductor layer formed on the exposed part of the underlayer and the mask layer while forming a void on the recess portions of the mask layer, and a nitride-based semiconductor element layer, formed on the nitride-based semiconductor layer, having an element region.

In the nitride-based semiconductor element according to the first aspect, the mask layer having a recess portion is formed on the substantially flat upper surface of the underlayer as hereinabove described, whereby the nitride-based semiconductor layer is formed with the void on the recess portion of the mask layer when laterally grown on the mask layer. This void relaxes strain of the laterally grown nitride-based semiconductor layer, whereby inclination of the c-axis (crystal axis) of the nitride-based semiconductor layer can be suppressed. Further, the underlayer is formed in a substantially flat shape, whereby no etching may be performed over a long time for forming recess portions on the surface of the underlayer consisting of a nitride-based semiconductor or the like, dissimilarly to the prior art. Therefore, inclination of the c-axis (crystal axis) of the nitride-based semiconductor layer can be suppressed without performing an etching process for a long time. Consequently, a nitride-based semiconductor layer having excellent crystallinity can be obtained without performing a long-time etching process. When the nitride-based semiconductor element layer having an element region is grown on the nitride-based semiconductor layer having excellent crystallinity, a nitride-based semiconductor element having excellent element characteristics can be obtained.

In the aforementioned nitride-based semiconductor element according to the first aspect, the recess portion of the mask layer preferably includes a dent provided on at least part of the upper surface of the mask layer. According to this structure, the void can be readily formed on the mask layer due to the dent when the nitride-based semiconductor layer is laterally grown on the mask layer.

In the aforementioned nitride-based semiconductor element according to the first aspect, the recess portion of the mask layer preferably includes a concavely curved upper surface of the mask layer. According to this structure, the void can be readily formed on the mask layer due to the concavely curved upper surface of the mask layer. In this case, the mask layer preferably has an overhanging shape, and the upper surface of the overhanging mask layer is preferably concavely curved. In this case, further, the overhanging mask layer preferably includes a first insulator film formed on the underlayer and a second insulator film, formed on the first insulator film, having a smaller etching rate than the first insulator film. According to this structure, the overhanging mask layer having a laterally protruding second insulator film can be readily obtained by forming the first and second insulator films and thereafter etching the second and first insulator films.

In the aforementioned nitride-based semiconductor element according to the first aspect, the underlayer preferably includes a substrate, and the mask layer is preferably formed to be in contact with the upper surface of the substrate. According to this structure, no underlayer may be formed on the substrate, whereby the fabrication process can be simplified. Further, the total thickness can be reduced due to absence of the underlayer.

A nitride-based semiconductor element according to a second aspect of the present invention comprises a mask layer, having a recess portion on the upper surface of the mask layer, formed on projection portions of an underlayer having the projection portions on an upper surface to partially expose the upper surface of the underlayer, a nitride-based semiconductor layer formed on the exposed part of the underlayer and the mask layer while forming a void on the recess portion of the mask layer, and a nitride-based semiconductor element layer, formed on the nitride-based semiconductor layer, having an element region.

In the nitride-based semiconductor element according to the second aspect, the mask layer having a recess portion is formed on the upper surface of the underlayer as hereinabove described, whereby the nitride-based semiconductor layer is formed with the void on the recess portion of the mask layer when laterally grown on the mask layer. This void relaxes strain of the laterally grown nitride-based semiconductor layer, whereby inclination of the c-axis (crystal axis) of the nitride-based semiconductor layer can be suppressed. When the recess portions are formed on the underlayer and the mask layer is formed on projection portions thereof to have an overhanging shape, raw material is hardly supplied to a portion located under the overhang of the mask layer, to result in difference in growth rate between the portion located under the overhang and the remaining portions. Thus, lateral growth is dominant in the portion located under the overhang having a low growth rate from an extremely initial stage, whereby dislocations start to laterally bend from the initial stage. Consequently, it is possible to more effectively prevent the dislocations from reaching the surface of the nitride-based semiconductor layer. Therefore, inclination of the c-axis (crystal axis) of the nitride-based semiconductor layer can be suppressed while further reducing the number of dislocations. Consequently, a nitride-based semiconductor layer having more excellent crystallinity can be obtained. When the nitride-based semiconductor element layer having an element region is grown on the nitride-based semiconductor layer having more excellent crystallinity, a nitride-based semiconductor element having more excellent element characteristics can be obtained.

In the aforementioned nitride-based semiconductor element according to the second aspect, the recess portion of the mask layer preferably includes a dent provided on at least part of the upper surface of the mask layer. According to this structure, the void can be readily formed on the mask layer due to the dent when the nitride-based semiconductor layer is laterally grown on the mask layer.

In the aforementioned nitride-based semiconductor element according to the second aspect, the recess portion of the mask layer preferably includes a concavely curved upper surface of the mask layer. According to this structure, the void can be readily formed on the mask layer due to the concavely curved surface of the mask layer. In this case, the mask layer preferably has an overhanging shape, and the upper surface of the overhanging mask layer is preferably concavely curved.

In the aforementioned nitride-based semiconductor element according to the second aspect, the underlayer preferably includes a substrate, and the mask layer is preferably formed to be in contact with the upper surface of the substrate. According to this structure, no underlayer may be formed on the substrate, whereby the fabrication process can be simplified. Further, the total thickness can be reduced due to absence of the underlayer.

A method of forming a nitride-based semiconductor according to a third aspect of the present invention comprises steps of forming a mask layer, having a recess portion on the upper surface of the mask layer on a substantially flat upper surface of an underlayer to partially expose the upper surface of the underlayer, and growing a nitride-based semiconductor layer on the exposed part of the underlayer and the mask layer.

In the method of forming a nitride-based semiconductor according to the third aspect, the mask layer having a recess portion is formed as hereinabove described, whereby the nitride-based semiconductor layer is formed with the void on the recess portion of the mask layer when laterally grown on the mask layer. The void relaxes strain of the laterally grown nitride-based semiconductor layer, whereby inclination of the c-axis (crystal axis) of the nitride-based semiconductor layer can be suppressed. The underlayer is formed in a substantially flat shape, whereby no etching may be performed over a long time for forming recess portions on the underlayer consisting of a nitride-based semiconductor or the like, dissimilarly to the prior art. Thus, inclination of the c-axis (crystal axis) of the nitride-based semiconductor layer can be suppressed without performing an etching process for a long time. Consequently, a nitride-based semiconductor layer having excellent crystallinity can be readily formed without performing a long-time etching process.

In the aforementioned method of forming a nitride-based semiconductor according to the third aspect, the step of forming the mask layer preferably includes a step of forming the mask layer on a prescribed region of the underlayer and thereafter partially etching the upper surface of the mask layer thereby forming the recess portion on the upper surface of the mask layer. According to this structure, the mask layer having the recess portion on the upper surface can be readily formed.

In the aforementioned method of forming a nitride-based semiconductor according to the third aspect, the step of forming the mask layer preferably includes steps of forming a first mask material layer on part of a region of the underlayer formed with the mask layer, forming a second mask material layer to cover the first mask material layer and the underlayer, and etching the second mask material layer while leaving the first mask material layer thereby forming the mask layer consisting of the first mask material layer and the second mask material layer and having the recess portion on the upper surface. According to this structure, the mask layer having the recess portion on the upper surface can be readily formed.

In the aforementioned method of forming a nitride-based semiconductor according to the third aspect, the underlayer preferably includes a substrate, and the step of forming the mask layer preferably includes a step of forming the mask layer to be in contact with the upper surface of the substrate. According to this structure, no underlayer may be formed on the substrate, whereby the fabrication process can be simplified. Further, the total thickness can be reduced due to absence of the underlayer.

The aforementioned method of forming a nitride-based semiconductor according to the third aspect preferably further comprises a step of growing a nitride-based semiconductor element layer having an element region on the nitride-based semiconductor layer. According to this structure, the nitride-based semiconductor element layer having an element region is grown on the nitride-based semiconductor layer having excellent crystallinity, whereby a nitride-based semiconductor element having excellent element characteristics can be readily formed.

A method of forming a nitride-based semiconductor according to a fourth aspect of the present invention comprises steps of forming a mask layer, having a recess portion on the upper surface of the mask layer on projection portions of an underlayer having the projection portions on upper surface for partially exposing the surface of the underlayer, and growing a nitride-based semiconductor layer on the exposed part of the underlayer and the mask layer.

In the method of forming a nitride-based semiconductor according to the fourth aspect, the mask layer having a recess portion is formed on the upper surface of the underlayer, whereby the nitride-based semiconductor layer is formed while a void remaining on the recess portion of the mask layer when laterally grown on the mask layer. This void relaxes strain of the laterally grown nitride-based semiconductor layer, whereby inclination of the c-axis (crystal axis) of the nitride-based semiconductor layer can be suppressed. When the projection portion is formed on the underlayer and the mask layer is formed on the projection portions thereof to have an overhanging shape, raw material is hardly supplied to a portion located under the overhang of the mask layer, inducing difference in growth rate between the portion located under the overhang and the remaining portions. Thus, lateral growth is dominant in the portion located under the overhang having a low growth rate from an extremely initial stage, whereby dislocations start to laterally bend from the initial stage. Consequently, it is possible to more effectively prevent the dislocations from reaching the surface of the nitride-based semiconductor layer. Therefore, inclination of the c-axis (crystal axis) of the nitride-based semiconductor layer can be suppressed while further reducing the number of dislocations. Consequently, a nitride-based semiconductor layer having more excellent crystallinity can be obtained.

In the aforementioned method of forming a nitride-based semiconductor according to the fourth aspect, the underlayer preferably includes a substrate, and the step of forming the mask layer preferably includes a step of forming the mask layer to be in contact with the upper surface of the substrate. According to this structure, no underlayer may be formed on the substrate, whereby the fabrication process can be simplified. Further, the total thickness can be reduced-due to absence of the underlayer.

The aforementioned method of forming a nitride-based semiconductor according to the fourth aspect preferably further comprises a step of growing a nitride-based semiconductor element layer having an element region on the nitride-based semiconductor layer. According to this structure, the nitride-based semiconductor element layer having an element region is grown on the nitride-based semiconductor layer having excellent crystallinity, whereby a nitride-based semiconductor element having excellent element characteristics can be readily formed.

A method of forming a nitride-based semiconductor according to a fifth aspect of the present invention comprises steps of forming a mask layer having an overhanging shape on a substantially flat upper surface of an underlayer to expose part of the flat upper surface of the underlayer, and growing a nitride-based semiconductor layer on the exposed part of the underlayer and the mask layer.

In the method of forming a nitride-based semiconductor according to the fifth aspect, the overhanging mask layer is formed as hereinabove described, whereby the nitride-based semiconductor layer applies upward force to the protrusion of the overhanging mask layer in the process of growth, for curving the upper surface of the overhanging mask layer and defining a dent. Thus, the nitride-based semiconductor layer is formed while forming a void on the upper surface of the curved dent of the mask layer. This void relaxes strain of the laterally grown nitride-based semiconductor layer, whereby inclination of the c-axis (crystal axis) of the nitride-based semiconductor layer can be suppressed. In this case, the curved dent of the mask layer reduces the contact area between the upper surface of the mask layer and the growth layer, whereby inclination of the c-axis can be reduced to substantially 0°. Consequently, a nitride-based semiconductor layer having more excellent crystallinity can be readily formed. When the underlayer is formed in a substantially flat shape, no etching may be performed over a long time for forming recess portions on the underlayer consisting of a nitride-based semiconductor or the like, dissimilarly to the prior art. Therefore, inclination of the c-axis (crystal axis) of the nitride-based semiconductor layer can be suppressed without performing an etching process over a long time. Consequently, a nitride-based semiconductor layer having more excellent crystallinity can be readily formed without performing a long-time etching process.

According to the fifth aspect, the step of growing the nitride-based semiconductor layer preferably includes a step of growing the nitride-based semiconductor layer from under the mask layer having an overhanging shape and applying force from under the overhang of the mask layer thereby curving the upper surface of the overhanging mask layer. According to this structure, the upper surface is curved to define a dent, whereby the nitride-based semiconductor layer can be readily formed while forming a void on the dent of the mask layer.

According to the fifth aspect, the step of forming the mask layer preferably includes steps of forming a first mask material layer on the underlayer while forming a second mask material layer having a smaller etching rate than the first mask material layer on the first mask material layer, and etching the first mask material layer and the second mask material layer thereby forming the overhanging mask layer having the first mask material layer and the second mask material layer. According to this structure, the overhanging mask layer can be readily formed.

In the aforementioned method of forming a nitride-based semiconductor according to the fifth aspect, the underlayer preferably includes a substrate, and the step of forming the mask layer preferably includes a step of forming the mask layer to be in contact with the upper surface of the substrate. According to this structure, no underlayer may be formed on the substrate, whereby the fabrication process can be simplified. Further, the total thickness can be reduced due to absence of the underlayer.

The aforementioned method of forming a nitride-based semiconductor according to the fifth aspect preferably further comprises a step of growing a nitride-based semiconductor element layer having an element region on the nitride-based semiconductor layer. According to this structure, the nitride-based semiconductor element layer having an element region is grown on the nitride-based semiconductor layer having excellent crystallinity, whereby a nitride-based semiconductor element having excellent element characteristics can be readily formed.

A method of forming a nitride-based semiconductor according to a sixth aspect of the present invention comprises steps of forming a mask layer, having an overhanging shape on projection portions of an upper surface of an underlayer having the projection portions to expose part of the upper surface of the underlayer, and growing a nitride-based semiconductor layer on the exposed part of the underlayer and the mask layer.

In the method of forming a nitride-based semiconductor according to the sixth aspect, the overhanging mask layer is formed as hereinabove described, whereby the nitride-based semiconductor layer applies upward force to the protrusion of the overhanging mask layer in the process of growth, for curving the upper surface of the overhanging mask layer and forming concavely curved surface. Thus, the nitride-based semiconductor layer is formed while forming a void on the upper surface of the curved dent of the mask layer. This void relaxes strain of the laterally grown nitride-based semiconductor layer, whereby inclination of the c-axis (crystal axis) of the nitride-based semiconductor layer can be suppressed. In this case, the curved dent of the mask layer reduces the contact area between the upper surface of the mask layer and the growth layer, whereby inclination of the c-axis can be reduced to substantially 0°. Consequently, a nitride-based semiconductor layer having more excellent crystallinity can be readily formed. When the underlayer is formed on projection portions and the mask layer is formed on projection portions thereof to have an overhanging shape, raw material is hardly supplied to a portion located under the overhang of the mask layer, to result in difference in growth rate between the portion located under the overhang and the remaining portions. Thus, lateral growth is dominant in the portion located under the overhang having a low growth rate from an extremely initial stage, whereby dislocations start to laterally bend from the initial stage. Consequently, it is possible to more effectively prevent the dislocations from reaching the surface of the nitride-based semiconductor layer. Therefore, inclination of the c-axis (crystal axis) of the nitride-based semiconductor layer can be suppressed while further reducing the number of dislocations. Consequently, a nitride-based semiconductor layer having more excellent crystallinity can be obtained.

According to the aforementioned sixth aspect, the step of growing the nitride-based semiconductor layer preferably includes a step of growing the nitride-based semiconductor layer from under the mask layer having an overhanging shape and applying force from under the overhang of the mask layer thereby curving the upper surface of the overhanging mask layer. According to this structure, the upper surface is curved to define a dent, whereby the nitride-based semiconductor layer can be readily formed while forming a void on the dent of the mask layer.

In the aforementioned method of forming a nitride-based semiconductor according to the sixth aspect, the underlayer preferably includes a substrate, and the step of forming the mask layer preferably includes a step of forming the mask layer to be in contact with the upper surface of the substrate. According to this structure, no underlayer may be formed on the substrate, whereby the fabrication process can be simplified. Further, the total thickness can be reduced due to absence of the underlayer.

The aforementioned method of forming a nitride-based semiconductor according to the sixth aspect preferably further comprises a step of growing a nitride-based semiconductor element layer having an element region on the nitride-based semiconductor layer. According to this structure, the nitride-based semiconductor element layer having an element region is grown on the nitride-based semiconductor layer having excellent crystallinity, whereby a nitride-based semiconductor element having excellent element characteristics can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

A method of forming a nitride-based semiconductor according to a first embodiment of the present invention is described with reference to FIGS. 1 to 4.

Figure 1:
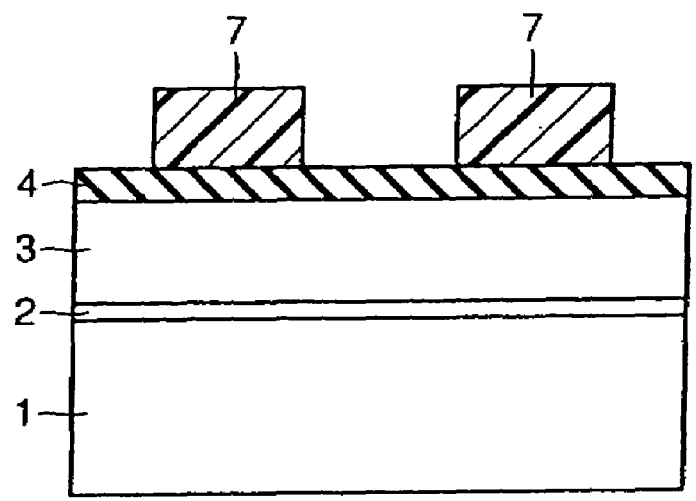
FIGS. 1 to 4 are sectional views for illustrating a method of forming a nitride-based semiconductor according to a first embodiment of the present invention.
Figure 2:
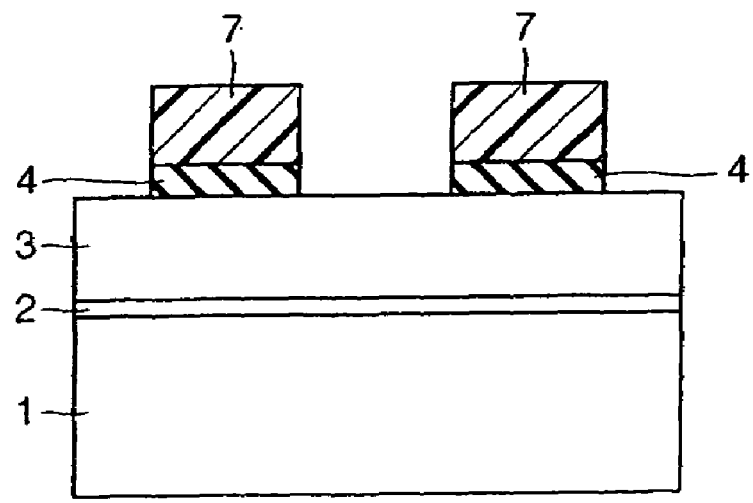

First, a low-temperature buffer layer 2 of GaN or AlGaN is grown on a sapphire substrate 1 by MOCVD (metal organic chemical vapor deposition) or HVPE (hydride vapor phase epitaxy) in a thickness of about 20 nm to about 30 nm, as shown in FIG. 1. An undoped GaN layer 3 of at least about 2 μm in thickness for serving as an underlayer is grown on the low-temperature buffer layer 2 by MOCVD or HVPE. A mask layer 4 of $SiO_2$ or SiN is formed on the undoped GaN layer 3. Resist films 7 are formed on prescribed regions of the mask layer 4. The resist films 7 are employed as masks for etching the mask layer 4, thereby forming patterned striped (elongated) mask layers 4 as shown in FIG. 2. The striped mask layers 4 are formed to have a cycle of about 10 μm. Thereafter the resist films 7 are removed.

Figure 3:
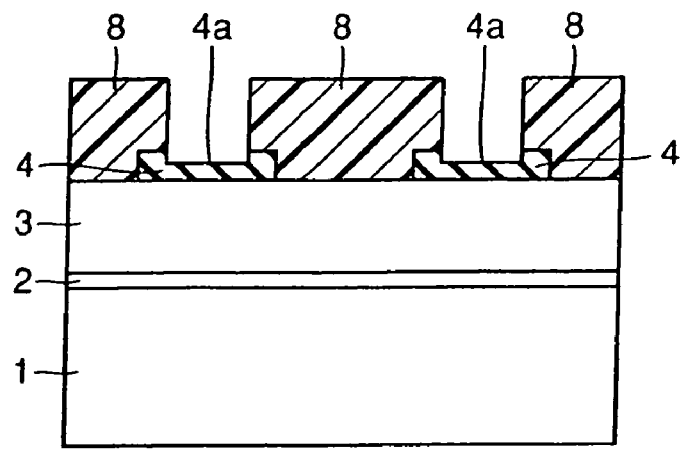

Then, resist films 8 are formed to cover ends of the mask layers 4 and exposed parts of the undoped GaN layer 3, as shown in FIG. 3. The resist films 8 are employed as masks for partially etching the upper surfaces of the mask layers 4, thereby forming recess portions 4a on the centers of the upper surfaces of the mask layers 4. The recess portions 4a are so formed that the mask layers 4 are about 6 μm in width and the recess portions 4a are about 4 μm in width. Further, the mask layers 4 are so etched that the ends thereof are about 0.5 μm in thickness and the parts formed with the recess portions 4a are about 0.2 μm to about 0.3 μm in thickness. Thereafter the resist films 8 are removed.

Figure 4:
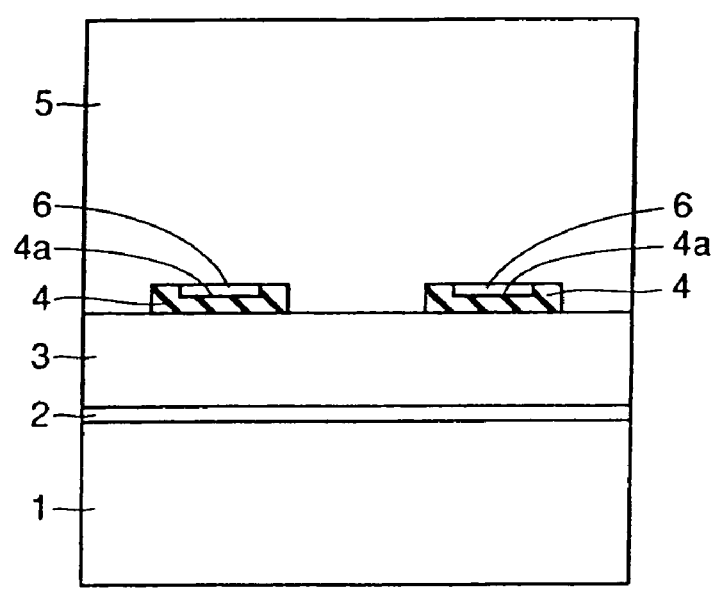

Then, the mask layers 4 having the recess portions 4a are employed as selective growth masks for epitaxially laterally overgrowing an undoped GaN layer 5 on the undoped GaN layer 3 and the mask layers 4, as shown in FIG. 4. The undoped GaN layer 5 having a flat upper surface is formed while forming voids 6 on the recess portions 4a of the mask layers 4.

According to the first embodiment, as hereinabove described, the mask layers 4 having the recess portions 4a are formed on the flat upper surface of the undoped GaN layer 3 serving as an underlayer, whereby the undoped GaN layer 5 is formed wile forming the voids 6 on the recess portions 4a of the mask layers 4 when laterally grown on the mask layers 4. The voids 6 relax strain of the undoped GaN layer 5 laterally grown on the mask layers 4, whereby inclination of the c-axis (crystal axis) of the undoped GaN layer 5 can be suppressed. According to the first embodiment, inclination of the c-axis of the undoped GaN layer 5 can be reduced to not more than about 0.1°.

Figure 30:
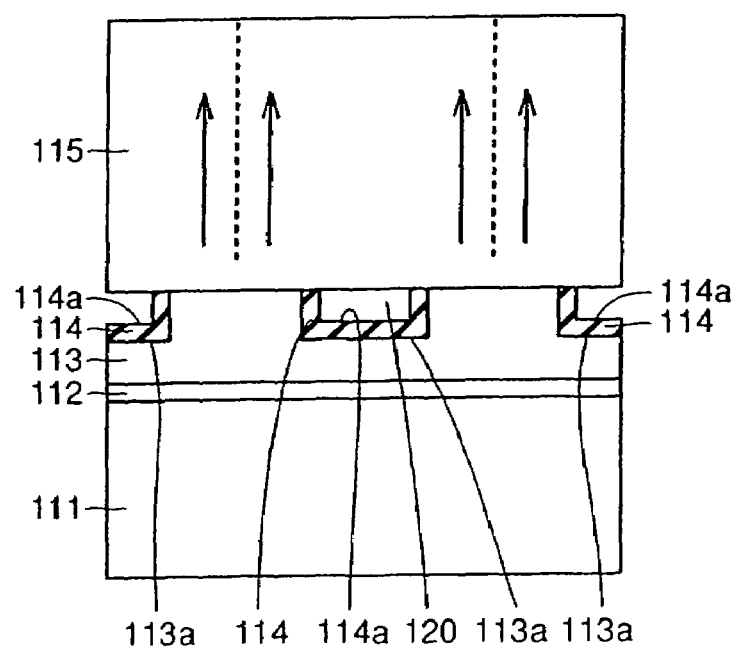
FIG. 30 is a sectional view for illustrating a conventional proposed method of forming a nitride-based semiconductor.

The undoped GaN layer 3 serving as an underlayer has a flat shape, whereby no etching may be performed over a long time for forming recess portion dissimilarly to the conventional proposed structure shown in FIG. 30. Therefore, inclination of the c-axis (crystal axis) of the epitaxially laterally overgrown undoped GaN layer 5 can be suppressed without performing an etching process over a long time. Consequently, the undoped GaN layer 5 having excellent crystallinity can be readily formed without performing a long-time etching process.

Figure 5:
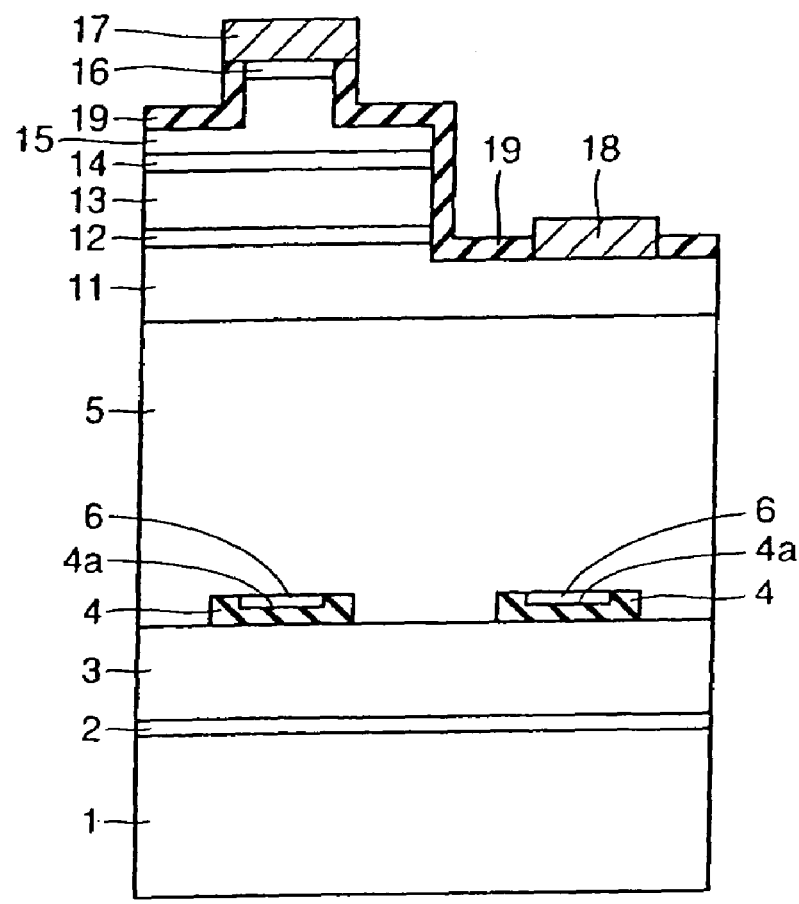
FIG. 5 is a sectional view showing a semiconductor laser device fabricated with the method of forming a nitride-based semiconductor according to the first embodiment of the present invention.

FIG. 5 is a sectional view of a semiconductor laser device fabricated with the aforementioned method of forming a nitride-based semiconductor according to the first embodiment. Referring to FIG. 5, an n-type GaN contact layer 11, doped with Si, having a thickness of about 5 μm is formed on the undoped GaN layer 5 shown in FIG. 4 in the semiconductor laser device according to the first embodiment. An n-type $In_{0.1}Ga_{0.9}N$ anti-cracking layer 12, doped with Si, having a thickness of about 0.1 μm is formed on the n-type GaN contact layer 11. An n-type $Al_{0.08}Ga_{0.92}N$ cladding layer 13, doped with Si, having a thickness of about 1 μm is formed on the n-type $In_{0.1}Ga_{0.9}N$ anti-cracking layer 12. An MQW emission layer 14 having a quantum well structure is formed on the n-type $Al_{0.08}Ga_{0.92}N$ cladding layer 13.

The MQW emission layer 14 includes a GaN guide layer, doped with Si, having a thickness of about 0.1 µm, an $In_{0.03}Ga_{0.97}N$ barrier layer, doped with Si, having a thickness of about 6 nm, an $In_{0.10}Ga_{0.90}N$ well layer, doped with Si, having a thickness of about 3 nm, an $In_{0.03}Ga_{0.97}N$ barrier layer, doped with Si, having a thickness of about 6 nm, an $In_{0.10}Ga_{0.90}N$ well layer, doped with Si, having a thickness of about 3 nm, an $In_{0.03}Ga_{0.97}N$ barrier layer, doped with Si, having a thickness of about 6 nm, an $In_{0.10}Ga_{0.90}N$ well layer, doped with Si, having a thickness of about 3 nm, an $In_{0.03}Ga_{0.97}N$ barrier layer, doped with Si, having a thickness of about 6 nm, an $Al_{0.2}Ga_{0.8}N$ cap layer, doped with Mg, having a thickness of about 2 nm and a GaN guide layer, doped with Mg, having a thickness of about 0.1 µm successively stacked from the side of the substrate 1.

A p-type $Al_{0.08}Ga_{0.92}N$ cladding layer 15, doped with Mg, having a thickness of about 0.4 µm is formed on the MQW emission layer 14. A p-type GaN contact layer 16, doped with Mg, having a thickness of about 0.1 µm is formed on the p-type $Al_{0.08}Ga_{0.92}N$ cladding layer 15. A p-side electrode 17 is formed on the p-type GaN contact layer 16. An n-side electrode 18 is formed on an exposed surface of the n-type GaN contact layer 11. Protective films 19 consisting of an insulator are formed to cover the side surfaces and the upper surfaces of the layers 11 to 16.

The aforementioned layers 11 to 16 are examples of the "nitride-based semiconductor element layer" according to the present invention.

In the aforementioned semiconductor laser device according to the first embodiment, the layers 11 to 16 are formed on the undoped GaN layer 5 reduced in inclination of the c-axis, formed by the method shown in FIGS. 1 to 4 without a long-time etching process, whereby excellent crystallinity can be implemented in the layers 11 to 16. According to the first embodiment, therefore, a semiconductor laser device having excellent device characteristics can be obtained without performing a long-time etching process.

Second Embodiment

Referring to FIGS. 6 to 10, a second embodiment of the present invention is described with reference to a method of directly epitaxially laterally overgrowing a nitride-based semiconductor layer on a substrate through mask layers having recess portions. The method according to the second embodiment is now described in detail.

Figure 6:
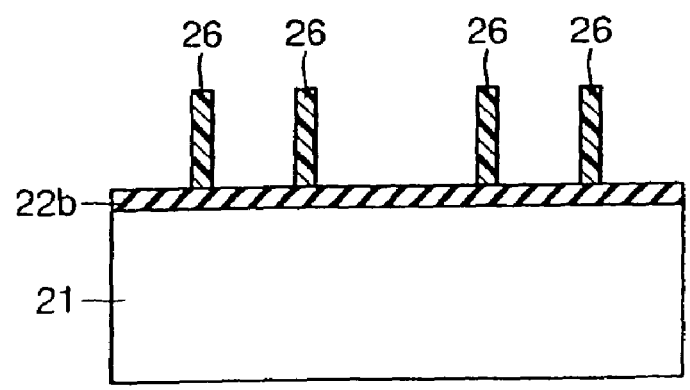
FIGS. 6 to 10 are sectional views for illustrating a method of forming a nitride-based semiconductor according to a second embodiment of the present invention.
Figure 7:
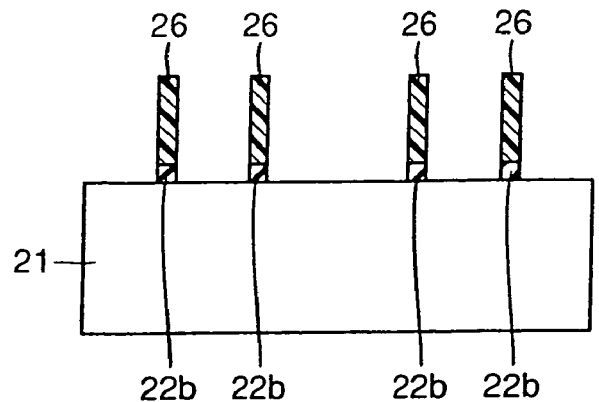

First, a first mask material layer 22b consisting of $SiO_2$ or SiN is formed on a sapphire substrate 21 in a thickness of about 0.2 µm to about 0.3 µm, as shown in FIG. 6. Resist films 26 are formed on prescribed regions of the first mask material layer 22b. The resist films 26 are employed as masks for etching the first mask material layer 22b, thereby forming patterned first mask material layers 22b as shown in FIG. 7. Thereafter the resist films 26 are removed.

Figure 8:
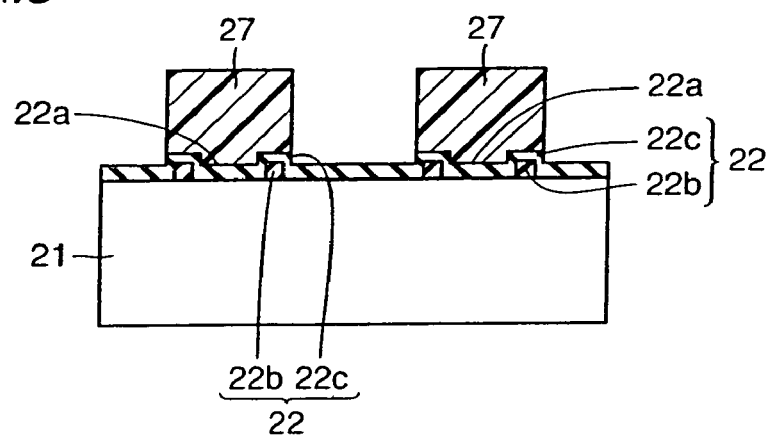
Figure 9:
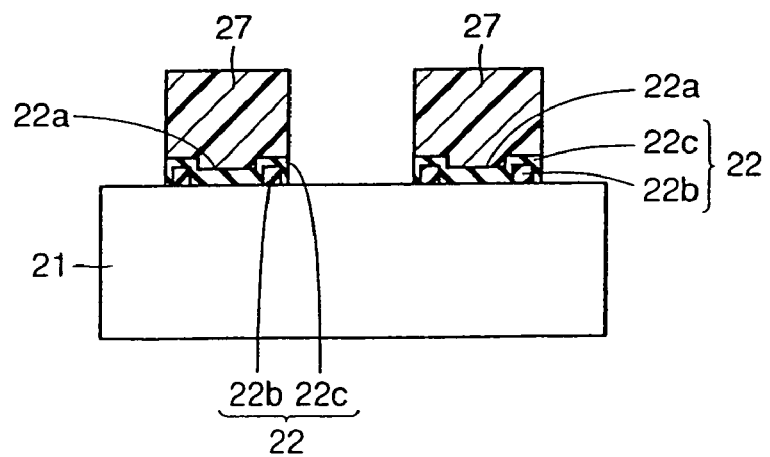

Then, a second mask material layer 22c of $SiO_2$ or SiN having a thickness of about 0.2 µm to about 0.3 µm is formed to cover the first mask material layers 22b and exposed parts of the sapphire substrate 21, as shown in FIG. 8. Thus, recess portions 22a are formed on the surface of the second mask material layer 22c. Resist films 27 are formed to cover the recess portions 22a and portions close to both ends of the recess portions 22a. The resist films 27 are employed as masks for etching the second mask material layer 22c, thereby forming mask layers 22 consisting of the patterned first and second mask material layers 22b and 22c, as shown in FIG. 9. The recess portions 22a are formed on the upper surfaces of the mask layers 22. The mask layers 22 are formed to have a width of about 6 µm, an end thickness of about 0.5 µm and a central thickness of about 0.2 µm to about 0.3 µm with the recess portions 22a of about 4 µm in width. The mask layers 22 are formed in a striped manner to have a cycle of about 10 µm. Thereafter the resist films 27 are removed.

Figure 10:
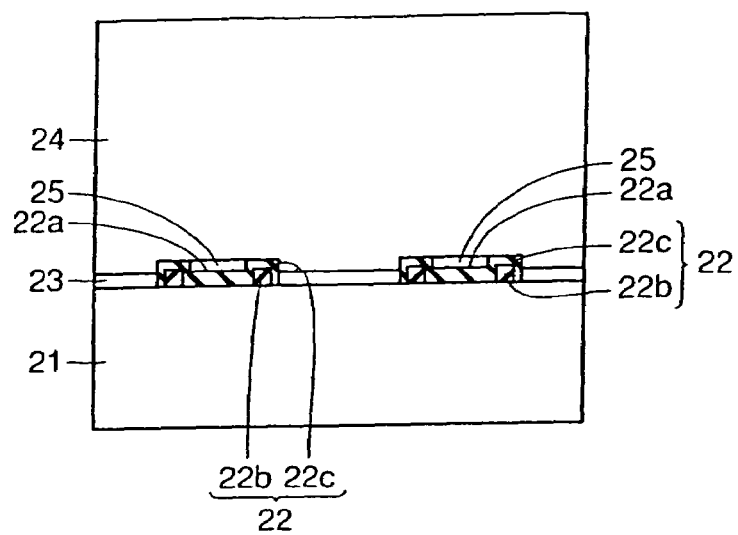

Then, low-temperature buffer layers 23 of GaN having a thickness of about 20 nm to about 30 nm are grown on exposed parts of the sapphire substrate 21 by MOCVD or HVPE located between the mask layers 22, as shown in FIG. 10. Thereafter an undoped GaN layer 24 is epitaxially laterally overgrown on the low-temperature buffer layers 23 and the mask layers 22, to have a flat upper surface. In this case, voids 25 are formed on the recess portions 22a of the mask layers 22. The voids 25 relax strain of the laterally grown undoped GaN layer 24 also in the second embodiment, whereby inclination of the c-axis (crystal axis) of the undoped GaN layer 24 can be reduced to not more than about 0.1°. The sapphire substrate 21 serving as an underlayer has a flat shape, whereby no etching process may be performed over a long time for forming recess portions on the GaN layer 24, dissimilarly to the prior art shown in FIG. 30. Therefore, inclination of the c-axis (crystal axis) of the undoped GaN layer 24 can be suppressed without performing a long-time etching process. Consequently, the undoped GaN layer 24 having excellent crystallinity can be obtained with no long-time etching process.

According to the second embodiment, the undoped GaN layer 24 is epitaxially laterally overgrown on the sapphire substrate 21, whereby no GaN layer for serving as an underlayer may be provided dissimilarly to the first embodiment. Therefore, the fabrication process can be more simplified as compared with the first embodiment.

Figure 11:
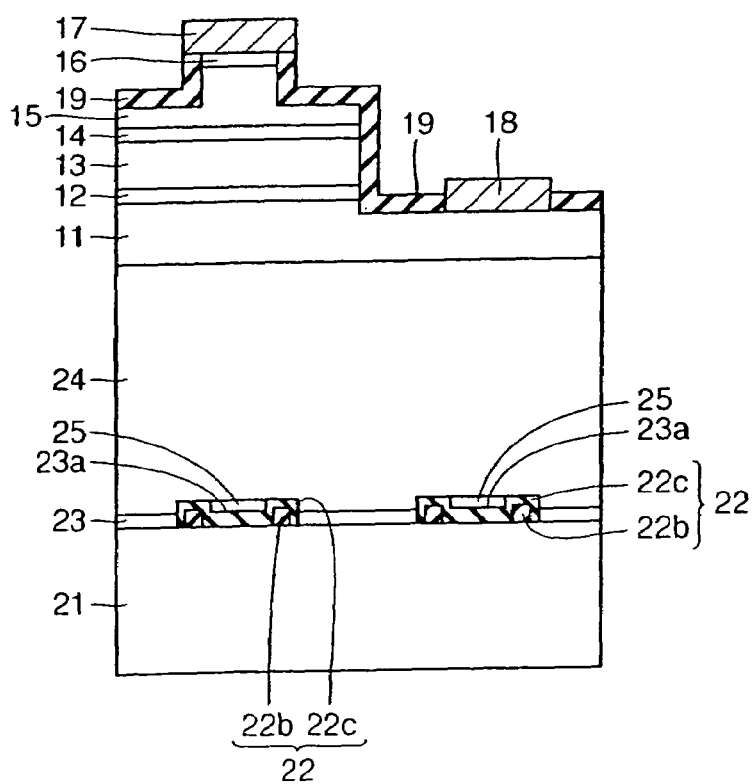
FIG. 11 is a sectional view showing a semiconductor laser device fabricated with the method of forming a nitride-based semiconductor according to the second embodiment of the present invention.

FIG. 11 is a sectional view showing a semiconductor laser device fabricated with the aforementioned method of forming a nitride-based semiconductor according to the second embodiment. Referring to FIG. 11, layers 11 to 16, electrodes 17 and 18 and protective films 19 similar to those of the first embodiment shown in FIG. 5 are formed on the undoped layer 24 shown in FIG. 10 in the second embodiment.

In the semiconductor laser device according to the second embodiment, the layers 11 to 16 are formed on the undoped GaN layer 24 reduced in inclination of the c-axis formed by the method according to the second embodiment shown in FIGS. 7 to 10 with no long-time etching process, whereby excellent crystallinity can be implemented in the layers 11 to 16. According to the second embodiment, therefore, a semiconductor laser device having excellent device characteristics can be obtained with no long-time etching process, similarly to the first embodiment.

Third Embodiment

A method of forming a nitride-based semiconductor according to a third embodiment of the present invention is now described with reference to FIGS. 12 to 14.

Figure 12:
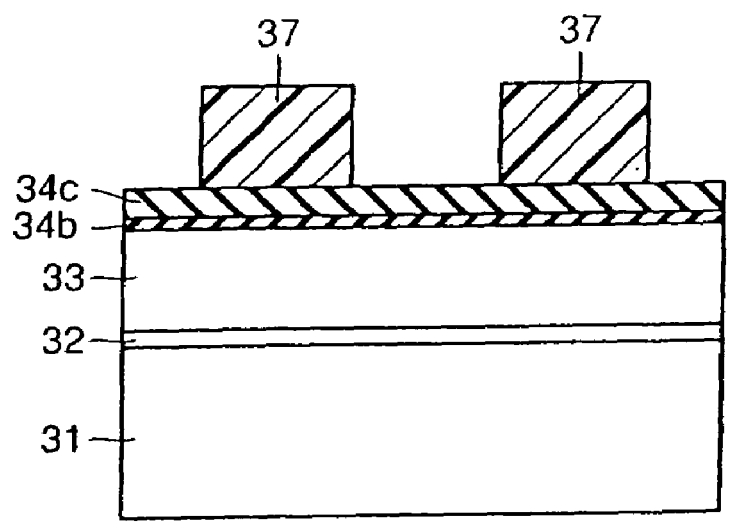
FIGS. 12 to 14 are sectional views for illustrating a method of forming a nitride-based semiconductor according to a third embodiment of the present invention.

First, a low-temperature buffer layer 32 of GaN or AlGaN having a thickness of about 20 nm to about 30 nm is grown on a sapphire substrate 31 by MOCVD or HVPE, as shown in FIG. 12. An undoped GaN layer 33 for serving as an underlayer is grown on the low-temperature buffer layer 32 by MOCVD or HVPE in a thickness of at least about 2 µm. A first mask material layer 34b of SiN having a thickness of about 0.05 µm is formed on the undoped GaN layer 33 by plasma CVD with RF power of 125 W. A second mask material layer 34c of SiN having a thickness of about 0.45 µm is formed on the first mask material layer 34b by plasma CVD with RF power of 250 W. Resist films 37 are formed on prescribed regions of the second mask material layer 34c.

The resist films 37 are employed as masks for wet-etching the second mask material layer 34c and the first mask material layer 34b with buffered hydrofluoric acid. In this case, the first mask material layer 34b formed under the aforementioned conditions is easier to etch as compared with the second mask material layer 34c. When the resist films 37 are employed as masks for over-etching the second mask material layer 34c and the first mask material layer 34b, therefore, striped mask layers 34 consisting of the first and second mask material layers 34b and 34c having an overhanging shape are formed as shown in FIG. 13. The striped mask layers 34 are formed to have a cycle of about 7 µm. Thereafter the resist films 37 are removed.

Figure 14:
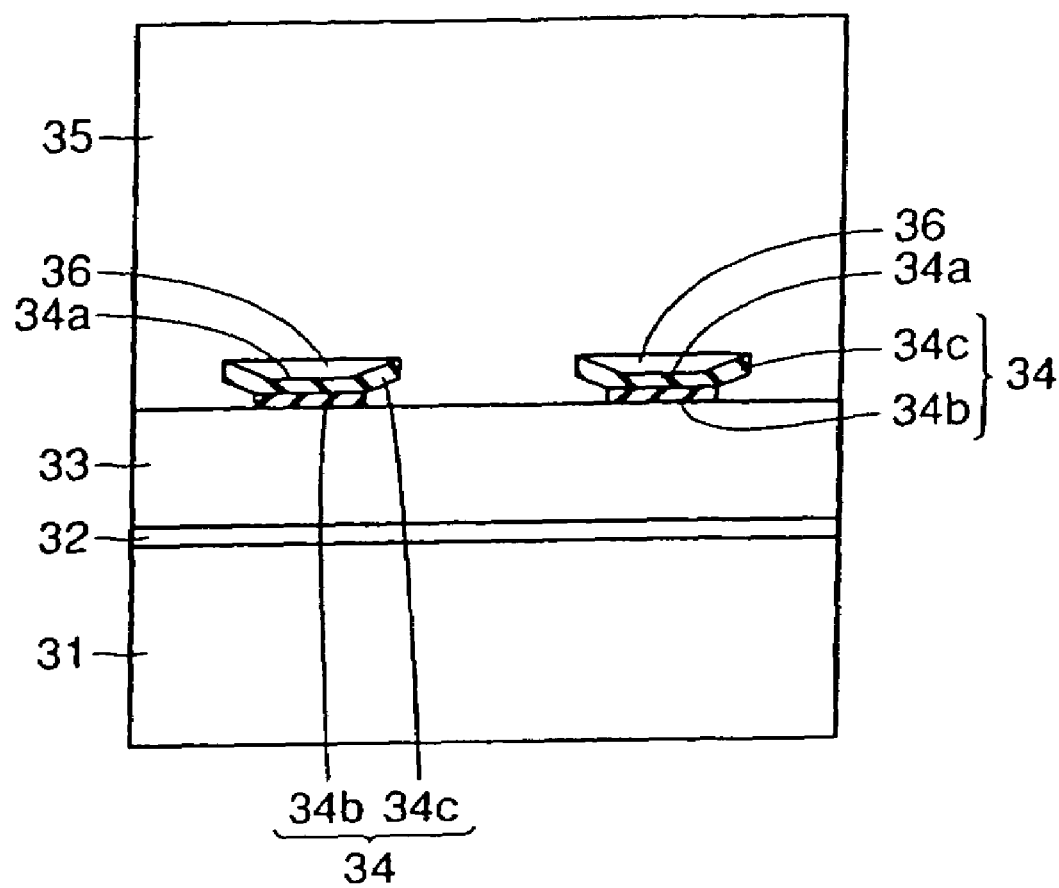

Then, the mask layers 34 are employed as selective growth masks for epitaxially laterally overgrowing an undoped GaN layer 35 on the undoped GaN layer 33 serving as an underlayer to have a flat upper surface, as shown in FIG. 14.

When the undoped GaN layer 35 is epitaxially laterally overgrown on the undoped GaN layer 33 serving as an underlayer in the third embodiment, the undoped GaN layer 35 applies upward force to protrusions (overhangs) of the overhanging mask layers 34 in the process of growth, thereby curving the upper surfaces of the overhanging mask layers 34. Thus, dents 34a are formed on the upper surfaces of the mask layers 34. When the undoped GaN layer 35 is continuously grown on the dents 34a, voids 36 are formed on the dents 34a.

The voids 36 relax strain of the laterally grown undoped GaN layer 35, whereby inclination of the c-axis (crystal axis) of the undoped GaN layer 35 can be suppressed. Particularly when the mask layers 34 are curved to form the dents 34a as in the third embodiment, the contact areas between the upper surfaces of the mask layers 34 and the grown undoped GaN layer 35 are more reduced as compared with aforementioned first and second embodiments, whereby inclination of the c-axis can be reduced substantially to 0°. Thus, according to the third embodiment, the undoped GaN layer 35 can be formed with superior crystallinity to those in the first and second embodiments.

According to the third embodiment, the undoped GaN layer 33 serving as an underlayer has a flat upper surface similarly to the aforementioned first embodiment, whereby no etching process may be performed over a long time for forming recess portions on the surface of the underlayer consisting of GaN dissimilarly to the prior art shown in FIG. 30. Consequently, inclination of the c-axis (crystal axis) of the undoped GaN layer 35 can be suppressed without performing a long-time etching process. Thus, the undoped GaN layer 35 having superior crystallinity can be readily formed with no long-time etching process.

Figure 15:
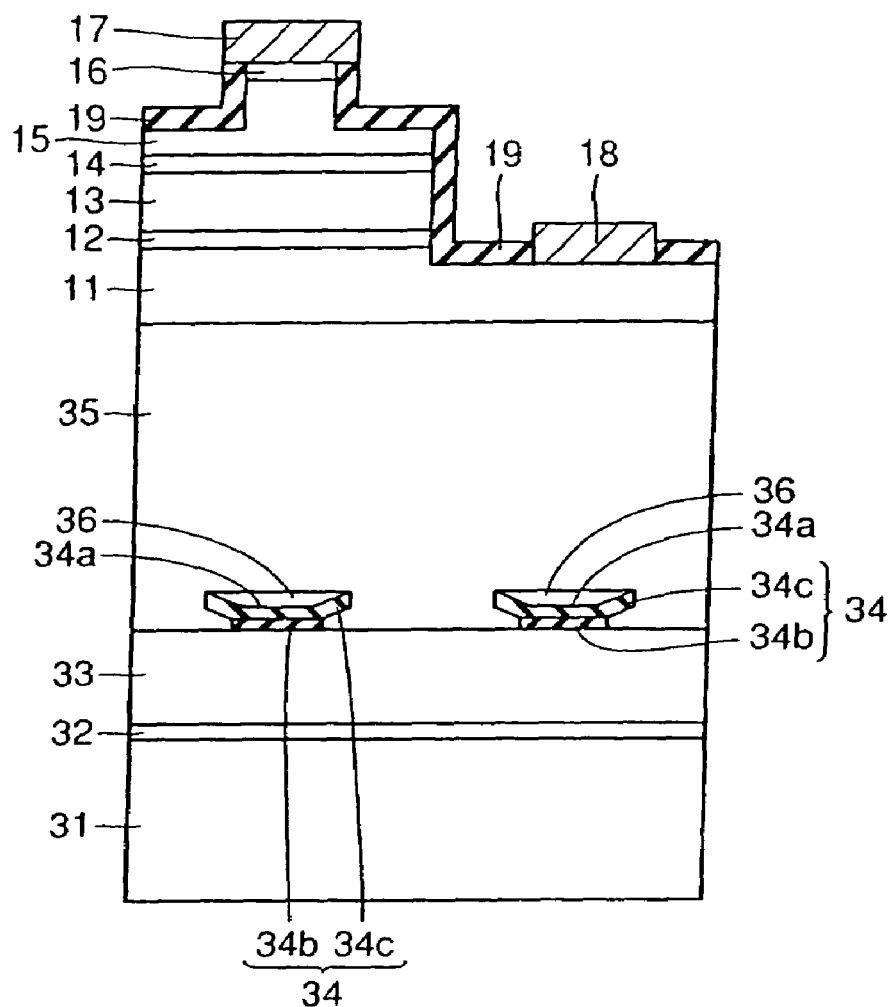
FIG. 15 is a sectional view showing a semiconductor laser device fabricated with the method of forming a nitride-based semiconductor according to the third embodiment of the present invention.

FIG. 15 is a sectional view showing a semiconductor laser device fabricated with the aforementioned method of forming a nitride-based semiconductor according to the third embodiment. Referring to FIG. 15, layers 11 to 16, electrodes 17 and 18 and protective films 19 similar to those of the first embodiment shown in FIG. 5 are formed on the undoped GaN layer 35 shown in FIG. 14 in the semiconductor laser device according to the third embodiment. Thus, the layers 11 to 16 are formed on the undoped GaN layer 35 hardly having inclination of the c-axis formed by the method shown in FIGS. 12 to 14 with no long-time etching process in the semiconductor laser device according to the third embodiment, whereby superior crystallinity can be implemented in the layers 11 to 16. Consequently, a semiconductor laser device having superior device characteristics can be obtained with no long-time etching process.

Fourth Embodiment

Figure 16:
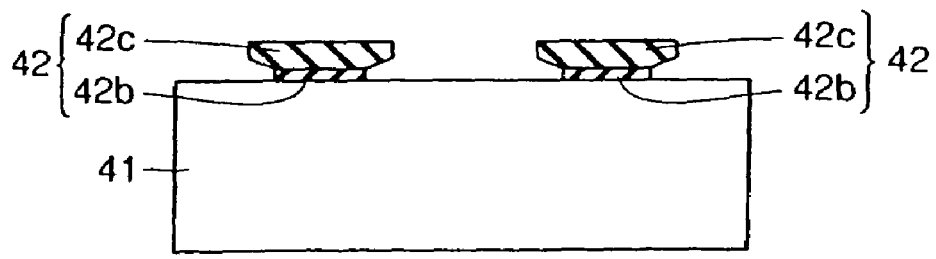
FIGS. 16 to 18 are sectional views for illustrating a method of forming a nitride-based semiconductor according to a fourth embodiment of the present invention.
Figure 17:
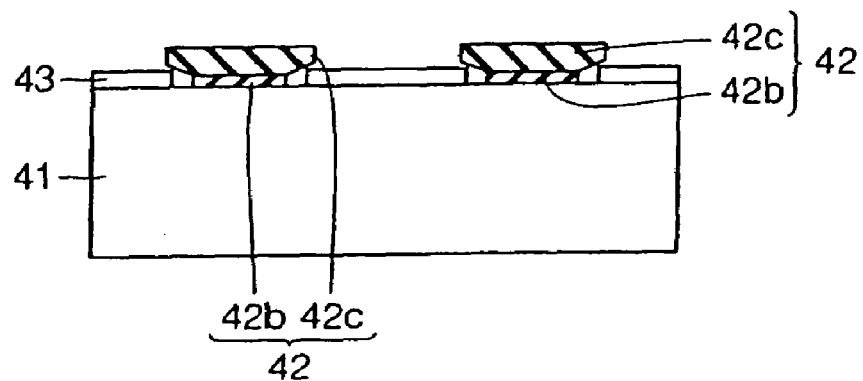
Figure 18:
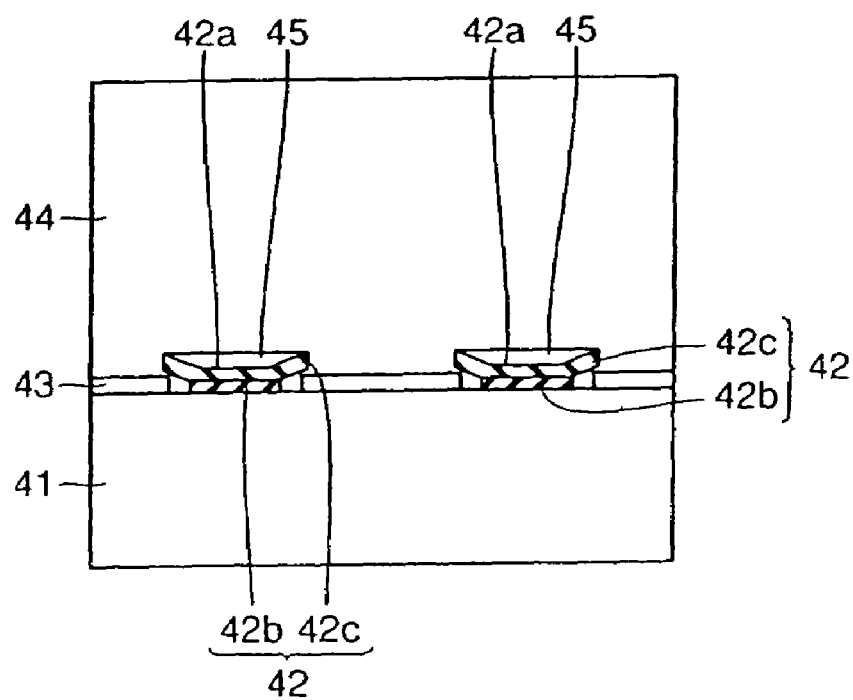

Referring to FIGS. 16 to 18, a fourth embodiment of the present invention is described with reference to an example of directly epitaxially laterally overgrowing a nitride-based semiconductor layer on a substrate without employing an underlayer dissimilarly to the aforementioned third embodiment.

Figure 13:
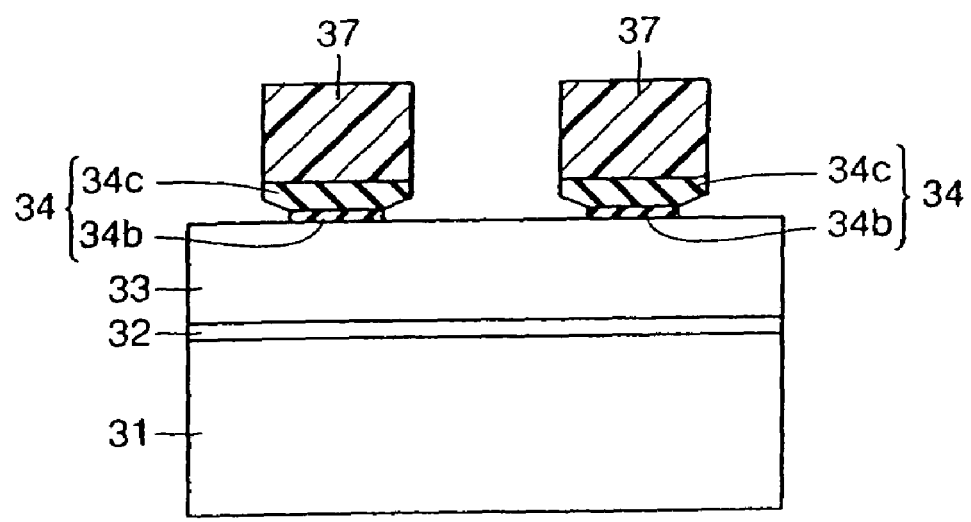

First, overhanging mask layers 42 consisting of first mask material layers 42b of SiN, formed by plasma CVD with RF power of 125 W, having a thickness of about 0.05 µm and second mask material layers 42c of SiN, formed by plasma CVD with RF power of 250 W, having a thickness of about 0.45 µm are formed on a sapphire substrate 41 through a process similar to that of the third embodiment shown in FIGS. 12 and 13, as shown in FIG. 16. The overhanging mask layers 42 are formed in the shape of stripes having a cycle of about 7 µm.

Then, low-temperature buffer layers 43 of GaN are grown on exposed parts of the sapphire substrate 41 by MOCVD or HVPE located between the mask layers 42 in a thickness of about 20 nm to about 30 nm, as shown in FIG. 17. In this state, the upper surfaces of the overhanging mask layers 42 are not curved.

Then, the overhanging mask layers 42 are employed as selective growth masks for epitaxially laterally overgrowing an undoped GaN layer 44 on the low-temperature buffer layers 43 and the mask layers 42 by MOCVD or HVPE, as shown in FIG. 18. In this case, the undoped GaN layer 44 grown under protrusions (overhangs) of the mask layers 42 apply upward force to the overhangs of the mask layers 42, whereby the upper surfaces of the mask layers 42 are curved to form dents 42a. When the undoped GaN layer 44 is further grown on the dents 42a, the undoped GaN layer 44 has a flat upper surface while forming voids 45 on the dents 42a.

The voids 45 relax strain of the laterally grown undoped GaN layer 44, whereby inclination of the c-axis (crystal axis) of the undoped GaN layer 44 can be suppressed. Particularly in the fourth embodiment, the mask layers 42 are curved to form the dents 42a similarly to the third embodiment, whereby the contact areas between the upper surfaces of the mask layers 42 and the grown undoped GaN layer 44 are more reduced as compared with the aforementioned first and second embodiments. Thus, inclination of the c-axis can be reduced substantially to 0°. Consequently, the undoped GaN layer 44 can be formed with superior crystallinity to those in the first and second embodiments according to the fourth embodiment.

According to the fourth embodiment, further, the sapphire substrate 41 serving as an underlayer has a flat shape, whereby no etching process may be performed over a long time for forming recess portions on the surface of the GaN layer serving as an dissimilarly to the prior art shown in FIG. 30. According to the fourth embodiment, therefore, inclination of the c-axis (crystal axis) of the undoped GaN layer 44 can be reduced to substantially 0° without performing a long-time etching process, similarly to the third embodiment. Consequently, the undoped GaN layer 44 having superior crystallinity can be formed with no long-time etching process.

According to the fourth embodiment, further, the undoped GaN layer 44 is directly epitaxially laterally overgrown on the sapphire substrate 41 through the low-temperature buffer layer 43 without employing an underlayer of GaN dissimilarly to the aforementioned third embodiment, whereby no GaN underlayer may be provided. According to the fourth embodiment, therefore, the fabrication process can be more simplified as compared with the third embodiment.

Figure 19:
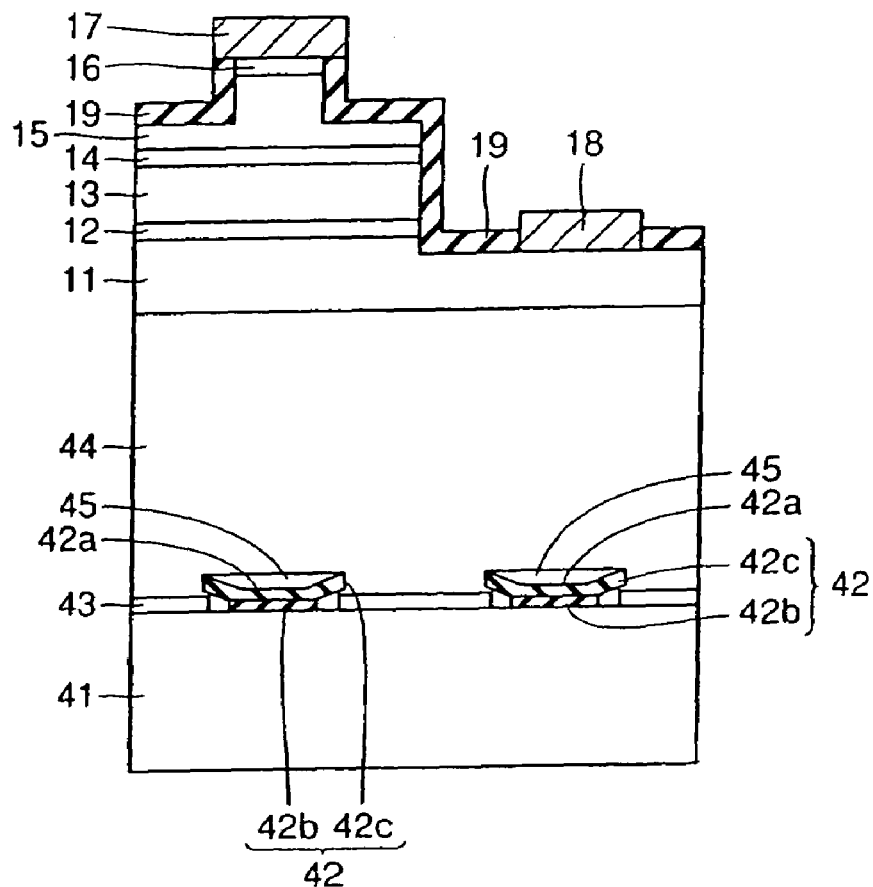
FIG. 19 is a sectional view showing a semiconductor laser device fabricated with the method of forming a nitride-based semiconductor according to the fourth embodiment of the present invention.

FIG. 19 is a sectional view showing a semiconductor laser device fabricated with the aforementioned method of forming a nitride-based semiconductor according to the fourth embodiment. Referring to FIG. 19, layers 11 to 16, electrodes 17 and 18 and protective films 19 similar to those of the first embodiment shown in FIG. 5 are formed on the undoped GaN layer 44 shown in FIG. 18 in the semiconductor laser device according to the fourth embodiment. The layers 11 to 16 are formed on the undoped GaN layer 44 suppressed to substantially 0° in inclination of the c-axis formed by the method shown in FIGS. 16 to 18 with no long-time etching process in the semiconductor laser device according to the fourth embodiment, whereby superior crystallinity can be implemented in the layers 11 to 16. Consequently, a semiconductor laser device having superior device characteristics can be obtained with no long-time etching process according to the fourth embodiment, similarly to the third embodiment.

Fifth Embodiment

A method of forming a nitride-based semiconductor according to a fifth embodiment of the present invention is now described with reference to FIGS. 20 to 22.

Figure 20:
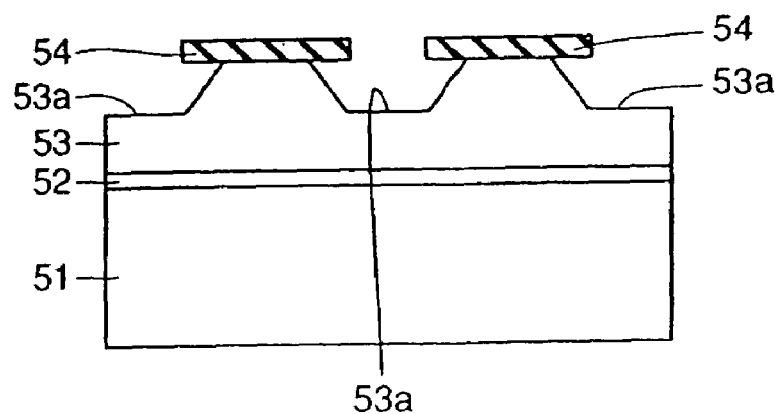
FIGS. 20 to 22 are sectional views for illustrating a method of forming a nitride-based semiconductor according to a fifth embodiment of the present invention.

First, a low-temperature buffer layer 52 of GaN or AlGaN is grown on a sapphire substrate 51 by MOCVD or HVPE in a thickness of about 20 nm to about 30 nm, as shown in FIG. 20. An undoped GaN layer 53 for serving as an underlayer is grown on the low-temperature buffer layer 52 by MOCVD or HVPE in a thickness of at least about 2 μm. Thereafter mask layers 54 of SiN or $SiO_2$ are formed on prescribed regions of the upper surface of the undoped GaN layer 53 in a thickness of about 0.2 μm and a width of about 4 μm. The mask layers 54 are formed in the shape of stripes to have a cycle of about 7 μm. The mask layers 54 are employed as masks for wet-etching the undoped GaN layer 53 serving as an underlayer, thereby forming recess portions 53a on the undoped GaN layer 53. The recess portions 53a are formed by etching the undoped GaN layer 53 until regions of the undoped GaN layer 53 located under both ends of the mask layers 54 are scooped. Thus, both ends of the mask layers 54 overhang to protrude above ends of the recess portions 53a of the undoped GaN layer 53.

Figure 21:
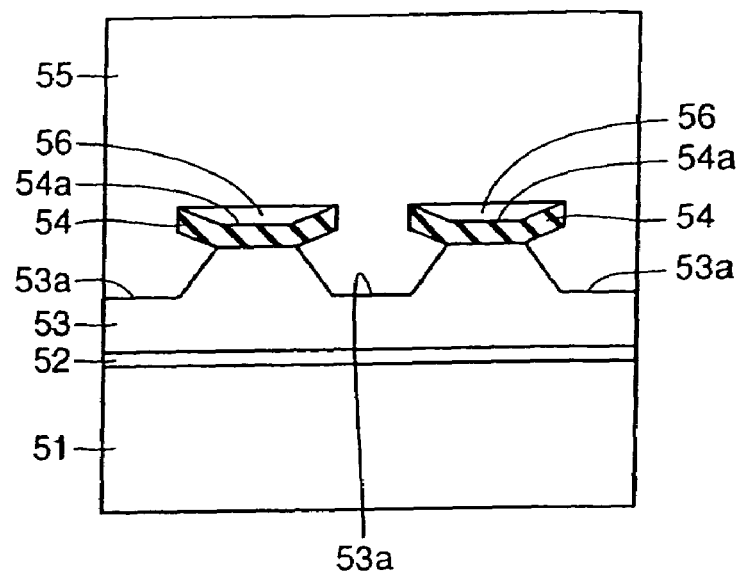
Figure 22:
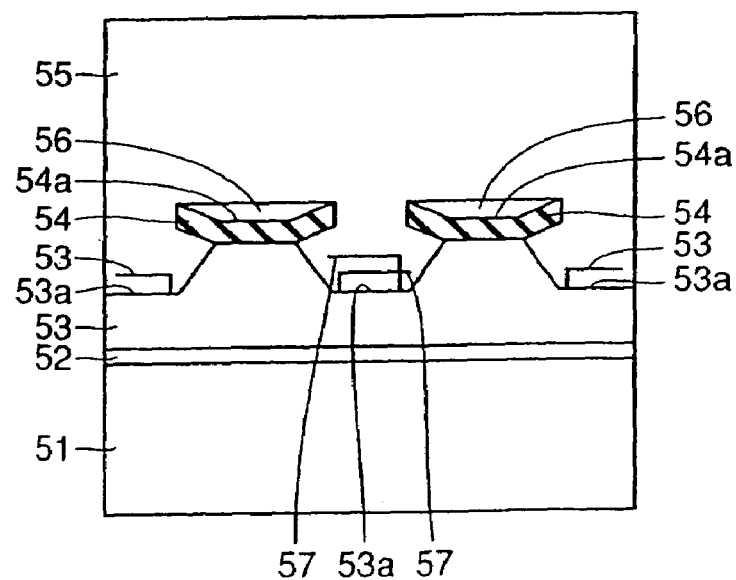

Then, the mask layers 54 are employed as selective growth masks for epitaxially laterally overgrowing an undoped GaN layer 55 on the recess portions 53a of the undoped GaN layer 53 serving as an underlayer and the mask layers 54, as shown in FIG. 21. In this case, the undoped GaN layer 55 grown on portions located under the overhangs of the mask layers 54 applies upward force to the overhangs of the mask layers 54, whereby the upper surfaces of the overhanging mask layers 54 are curved to form dents 54a. The undoped GaN layer 55 is further grown on the dents 54a to have a flat upper surface while forming voids 56 on the dents 54a.

The voids 56 relax strain of the laterally grown undoped GaN layer 55, whereby inclination of the c-axis of the undoped GaN layer 55 can be suppressed. According to the fifth embodiment, the mask layers 54 are curved to form the dents 54a similarly to the aforementioned third and fourth embodiments, whereby the contact areas between the upper surfaces of the mask layers 54 and the grown undoped GaN layer 55 are more reduced as compared with those in the aforementioned first and second embodiments and hence inclination of the c-axis can be reduced substantially to 0°. Thus, according to the fifth embodiment, the undoped GaN layer 55 can be formed with superior crystallinity to those in the first and second embodiments.

Figure 31:
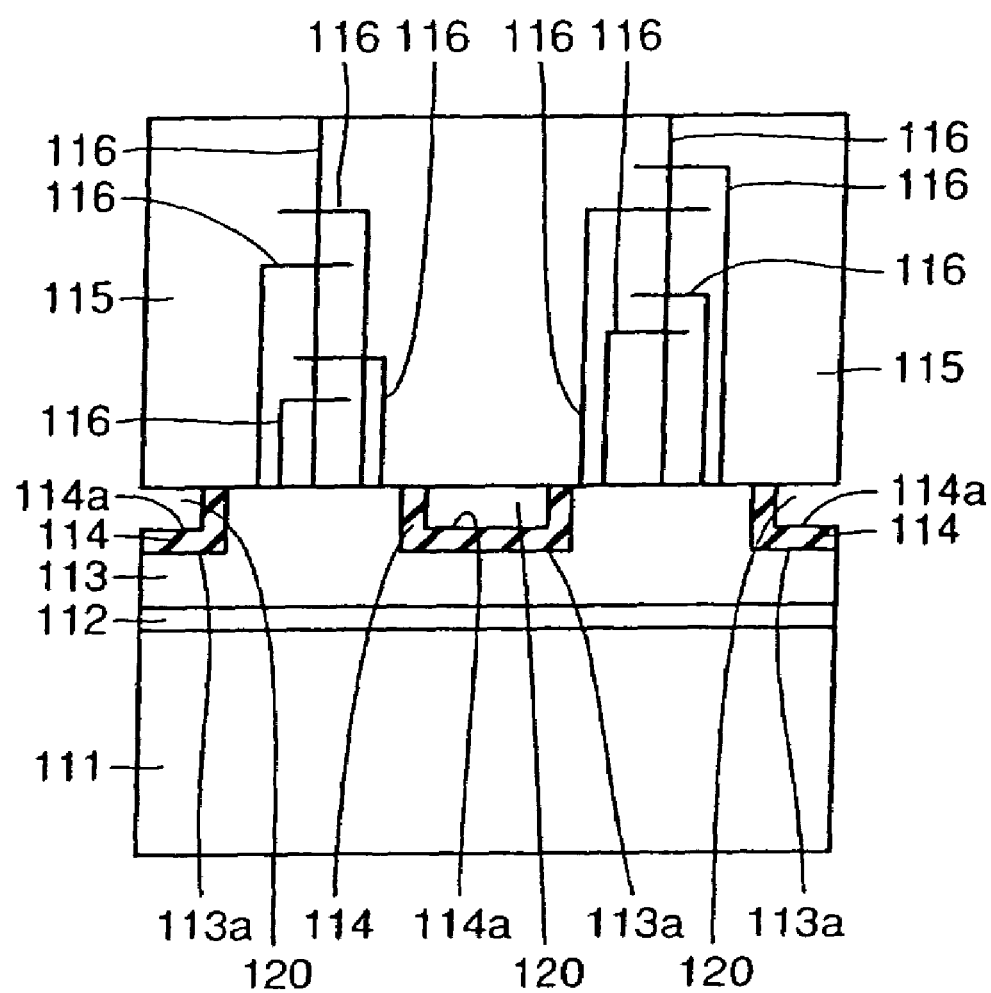
FIG. 31 is a sectional view for illustrating a problem in the conventional proposed method of forming a nitride-based semiconductor shown in FIG. 30.

According to the fifth embodiment, raw material is hardly supplied to portions located under the overhangs of the mask layers 54 in growth of the undoped GaN layer 55, to cause difference in growth rate between the portions located under the overhangs and the remaining portions. Thus, lateral growth is dominant from an extremely initial stage in the portions located under the overhangs having a low growth rate, whereby dislocations 57 start to laterally bend from the initial stage, as shown in FIG. 22. Therefore, the dislocations 57 hardly reach the upper surface of the undoped GaN layer 55. Thus, the number of dislocations 57 of the undoped GaN layer 55 can be more reduced as compared with the prior art shown in FIG. 31. Consequently, inclination of the c-axis of the undoped GaN layer 55 can be reduced substantially to 0° while reducing the number of dislocations 57 in the fifth embodiment. Thus, the undoped GaN layer 55 can be formed with superior crystallinity to those in the aforementioned first to fourth embodiments.

Figure 23:
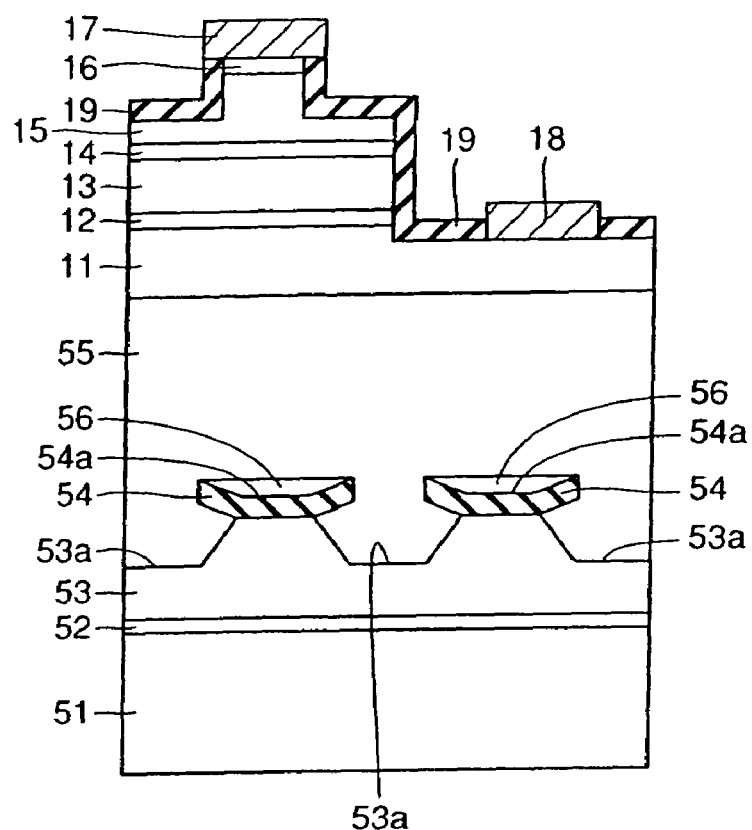
FIG. 23 is a sectional view showing a semiconductor laser device fabricated with the method of forming a nitride-based semiconductor according to the fifth embodiment of the present invention.

FIG. 23 is a sectional view showing a semiconductor laser device fabricated with the aforementioned method of forming a nitride-based semiconductor according to the fifth embodiment. Referring to FIG. 23, layers 11 to 16, electrodes 17 and 18 and protective films 19 similar to those of the first embodiment shown in FIG. 5 are formed on the undoped GaN layer 55 shown in FIG. 22 in the semiconductor laser device according to the fifth embodiment. The layers 11 to 16 are formed on the undoped GaN layer 55 having substantially no inclination of the c-axis and a further reduced number of dislocations formed by the method shown in FIGS. 20 to 22 in the semiconductor laser device according to the fifth embodiment, whereby superior crystallinity can be implemented in the layers 11 to 16. Consequently, a semiconductor laser device having superior device characteristics can be obtained according to the fifth embodiment.

Sixth Embodiment

Referring to FIGS. 24 to 27, a sixth embodiment of the present invention is described with reference to a case of directly growing a nitride-based semiconductor layer on a substrate without employing an underlayer in the aforementioned fifth embodiment. A method of forming a nitride-based semiconductor according to the sixth embodiment is now described with reference to FIGS. 24 to 27.

Figure 24:
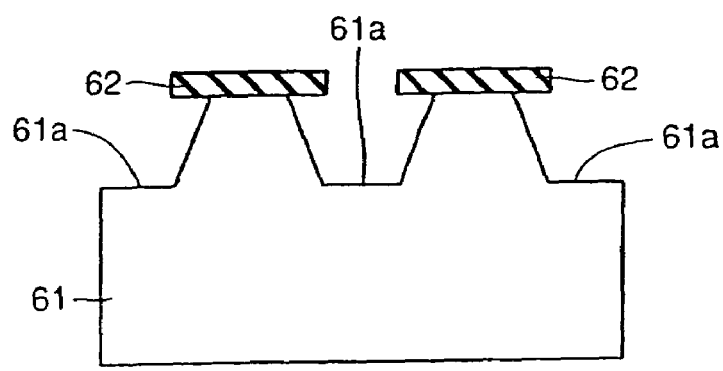
FIGS. 24 to 27 are sectional views for illustrating a method of forming a nitride-based semiconductor according to a sixth embodiment of the present invention.

First, mask layers 62 of $SiO_2$ or SiN are formed on prescribed regions of an n-type Si substrate 61 to have a thickness of about 0.2 μm and a width of about 4 μm, as shown in FIG. 24. In this case, the mask layers 62 are formed in the shape of stripes in a cycle of about 7 μm. The mask layers 62 are employed as masks for wet-etching the n-type Si substrate 61, thereby forming recess portions 61a on the n-type Si substrate 61. The recess portions 61a are formed by etching the n-type Si substrate 61 until portions located under both ends of the mask layers 62 are scooped. Thus, both end portions of the mask layers 62 overhang to protrude above ends of the recess portions 61a of the n-type Si substrate 61.

Figure 25:
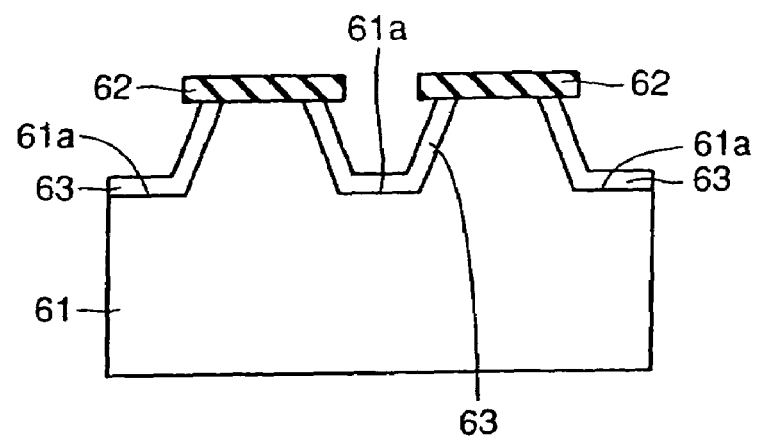

Then, the overhanging mask layers 62 are employed as masks for growing low-temperature buffer layers 63 of GaN or AlGaN on the surfaces of the recess portions 61a of the n-type Si substrate 61 by MOCVD or HVPE in a thickness of about 20 nm to about 30 nm, as shown in FIG. 25.

Figure 26:
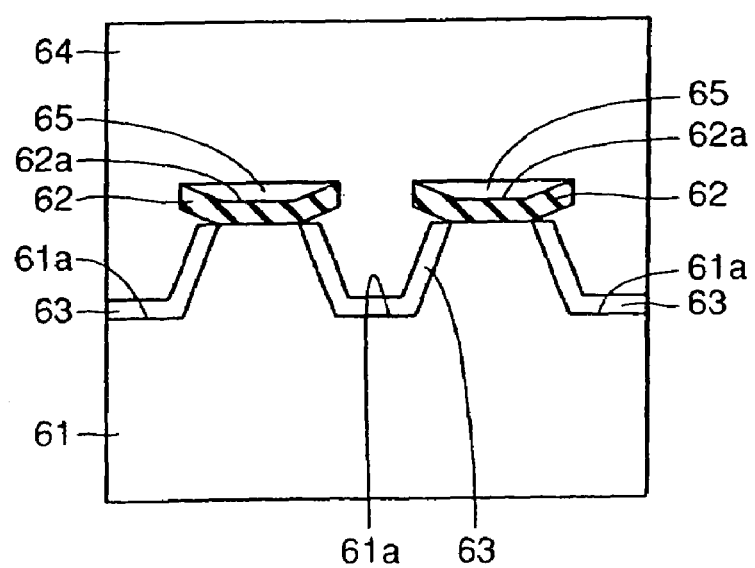

Then, the overhanging mask layers 62 are employed as selective growth masks for epitaxially laterally overgrowing an undoped GaN layer 64 by MOCVD or HVPE on the low-temperature buffer layers 63 and the mask layers 62, as shown in FIG. 26. In this case, the undoped GaN layer 64 grown on portions located under the overhangs of the mask layers 62 applies upward force to the overhangs of the mask layers 62, whereby the upper surfaces of the mask layers 62 are curved to form dents 62a. The undoped GaN layer 64 is further grown on the dents 62a, to have a flat upper surface while forming voids 65 on the dents 62a.

The voids 65 formed by curving the mask layers 62 reduce the contact areas between the upper surfaces of the mask layers 62 and the undoped GaN layer 64, whereby inclination of the c-axis of the laterally grown undoped GaN layer 64 can be reduced substantially to 0°, similarly to the aforementioned fifth embodiment.

Figure 27:
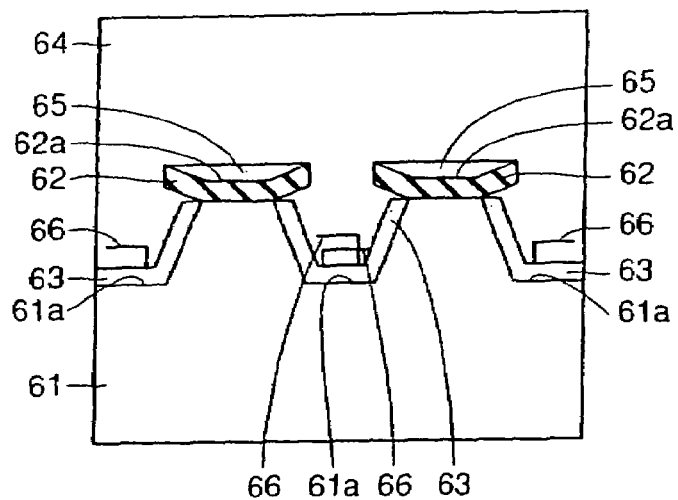

According to the sixth embodiment, raw material is hardly supplied to portions located under the overhangs of the mask layers 62 in growth of the undoped GaN layer 64, to cause difference in the growth rate of the undoped GaN layer 64 between the portions located under the overhangs and the remaining portions. Thus, lateral growth is dominant from an extremely initial stage in the portions located under the overhangs having a low growth rate, whereby dislocations 66 start to laterally bend from the initial stage, as shown in FIG. 27. Therefore, the dislocations 66 can be more effectively prevented from reaching the surface of the undoped GaN layer 64. Thus, according to the sixth embodiment, the number of dislocations 66 of the undoped GaN layer 64 can be more reduced as compared with the prior art shown in FIG. 31. Consequently, inclination of the c-axis can be reduced substantially to 0° while reducing the number of dislocations 66 in the sixth embodiment, whereby the undoped GaN layer 64 having superior crystallinity can be obtained similarly to the fifth embodiment.

In the sixth embodiment, further, the undoped GaN layer 64 is directly formed o the n-type Si substrate 61 through the low-temperature buffer layers 63 without employing a GaN underlayer dissimilarly to the aforementioned fifth embodiment, whereby the fabrication process can be more simplified as compared with the fifth embodiment due to absence of the GaN underlayer.

Figure 28:
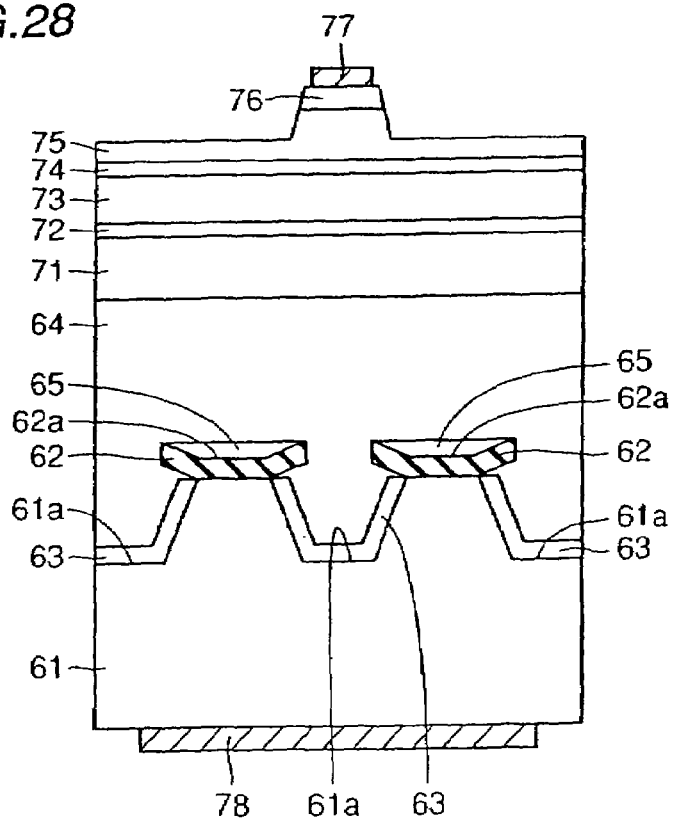
FIG. 28 is a sectional view showing a semiconductor laser device fabricated with the method of forming a nitride-based semiconductor according to the sixth embodiment of the present invention.
Figure 29:
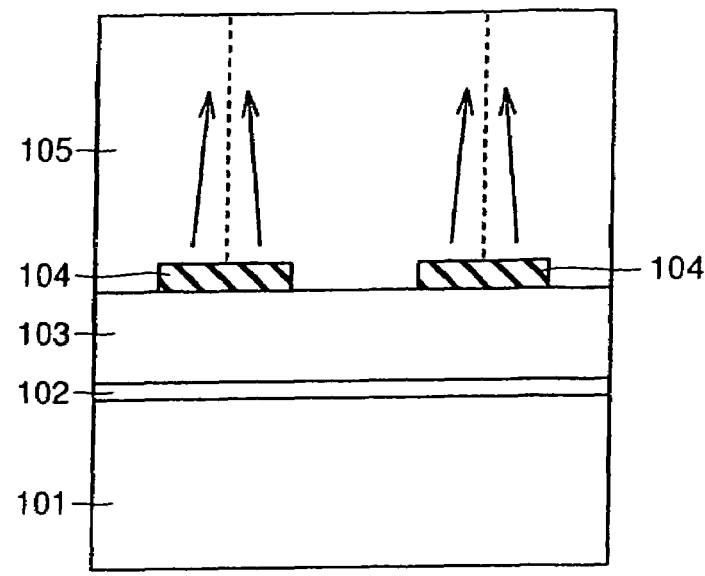
FIG. 29 is a sectional view for illustrating a conventional method of forming a nitride-based semiconductor.

FIG. 28 is a sectional view showing a semiconductor laser device fabricated with the aforementioned method of forming a nitride-based semiconductor according to the sixth embodiment. Referring to FIG. 28, the conductive n-type Si substrate 61 is employed in the sixth embodiment dissimilarly to the semiconductor laser devices according to the aforementioned first to fifth embodiments, and hence an n-side electrode 78 is provided on the back surface of the n-type Si substrate 61.

An n-type GaN contact layer 71 doped with Si is formed on the undoped GaN layer 64 shown in FIG. 26 in a thickness of about 5 µm. An n-type $In_{0.1}Ga_{0.9}N$ anti-cracking layer 72 doped with Si is formed on the n-type GaN contact layer 71 in a thickness of about 0.1 µm. An n-type $Al_{0.08}Ga_{0.92}N$ cladding layer 73 doped with Si is formed on the n-type $In_{0.1}Ga_{0.9}N$ anti-cracking layer 72 in a thickness of about 1 µm. An MQW emission layer 74 having a quantum well structure is formed on the n-type $Al_{0.08}Ga_{0.92}N$ cladding layer 73. The compositions and the thicknesses of layers forming the MQW emission layer 74 are identical to those of the MQW emission layer 14 according to the first embodiment shown in FIG. 5.

A p-type $Al_{0.08}Ga_{0.92}N$ cladding layer 75, doped with Mg, having a thickness of about 0.4 µm is formed on the MQW emission layer 74. A p-type GaN contact layer 76, doped with Mg, having a thickness of about 0.1 µm is formed on the p-type $Al_{0.08}Ga_{0.92}N$ cladding layer 75. A p-side electrode 77 is formed on the p-type GaN contact layer 76. The aforementioned layers 71 to 76 are examples of the "nitride-based semiconductor element layer" according to the present invention.

In the semiconductor laser device according to the aforementioned sixth embodiment, the layers 71 to 76 are formed on the undoped GaN layer 64 having a more reduced number of dislocations with inclination of the c-axis reduced substantially to 0° formed by the method shown in FIGS. 24 to 27, whereby superior crystallinity can be implemented in the layers 71 to 76. Therefore, a semiconductor laser device having superior device characteristics can be obtained according to the sixth embodiment.

Although the present invention has been described and illustrated in detail, it is clearly understood that the same is by way of illustration and example only and is not to be taken by way of limitation, the spirit and scope of the present invention being limited only by the terms of the appended claims.

While the mask layers having recess portions or dents are made of SiN or $SiO_2$ in each of the aforementioned embodiments, for example, the present invention is not restricted to this but the mask layers may alternatively be made of another insulator film material or high melting point metal material.

While the overhanging mask layers are formed by etching two types of SiN layers formed by plasma CVD at different RF power levels in each of the aforementioned third and fourth embodiments, the present invention is not restricted to this but the overhanging mask layers may alternatively be formed by another method. For example, it is also possible to form overhanging mask layers by forming lower first mask material layers of $SiO_2$ having a thickness of about 0.05 µm by EB (Electron Beam) evaporation and upper second mask material layers of SiN having a thickness of about 0.45 µm by plasma CVD with RF power of 250 W and thereafter etching the first and second mask material layers. This is because the lower first mask material layers formed in the aforementioned manner are easier to etch as compared with the upper second mask material layers.

While the mask layers having recess portions are formed by different methods in the aforementioned first and second embodiments, the present invention is not restricted to this but mask layers formed by the method according to the second embodiment may be employed in the structure according to the first embodiment, or mask layers having recess portions formed by the method according to the first embodiment may be employed in the structure according to the second embodiment.

While the sapphire substrate or the Si substrate is employed in each of the aforementioned embodiments, the present invention is not restricted to this but an SiC substrate, a GaN substrate, a GaAs substrate, a spinel substrate, a GaP substrate, an InP substrate, a crystal substrate, a ZnO substrate or a $ZrB_2$ substrate may alternatively be employed.

What is claimed is:

1. A method of forming a nitride-based semiconductor comprising steps of:
   forming a mask layer having an overhanging shape on a substantially flat upper surface of an underlayer to expose part of said flat upper surface of said underlayer; and
   growing a nitride-based semiconductor layer on said exposed part of said underlayer and said mask layer.

2. The method of forming a nitride-based semiconductor according to claim 1, wherein
   said step of growing said nitride-based semiconductor layer includes a step of growing said nitride-based semiconductor layer from under said mask layer having an overhanging shape and applying force from under the overhang of said mask layer thereby curving the upper surface of said overhanging mask layer.

3. The method of forming a nitride-based semiconductor according to claim 1, wherein
   said step of forming said mask layer includes steps of:
   forming a first mask material layer on said underlayer while forming a second mask material layer having a smaller etching rate than said first mask material layer on said first mask material layer, and
   etching said first mask material layer and said second mask material layer thereby forming said overhanging mask layer having said first mask material layer and said second mask material layer.

4. The method of forming a nitride-based semiconductor according to claim 1, wherein
   said underlayer includes a substrate, and
   said step of forming said mask layer includes a step of forming said mask layer to be in contact with the upper surface of said substrate.

5. The method of forming a nitride-based semiconductor according to claim 1, further comprising a step of growing a nitride-based semiconductor element layer having an element region on said nitride-based semiconductor layer.

* * * * *